United States Patent
Christopherson et al.

(10) Patent No.: US 6,950,005 B2
(45) Date of Patent: Sep. 27, 2005

(54) ADJUSTABLE COILFORM FOR VARIABLE INDUCTANCE

(75) Inventors: Scott Lee Christopherson, Rochester, MN (US); Edward Charles Gillard, Mantorville, MN (US); Don Alan Gilliland, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 150 days.

(21) Appl. No.: 10/610,272

(22) Filed: Jun. 30, 2003

(65) Prior Publication Data

US 2004/0263307 A1 Dec. 30, 2004

(51) Int. Cl.$^7$ .............................................. H01F 27/30
(52) U.S. Cl. ..................................................... 336/198
(58) Field of Search ................................ 336/5, 10, 30, 336/40, 65, 83, 87, 90, 192, 198; 335/216

(56) References Cited

U.S. PATENT DOCUMENTS

| | | | | |
|---|---|---|---|---|
| 3,432,785 A | * | 3/1969 | Solmos | 336/198 |
| 3,437,968 A | * | 4/1969 | Hildebrandt | 336/119 |
| 4,035,740 A | * | 7/1977 | Schafer et al. | 372/53 |
| 4,109,224 A | * | 8/1978 | Liautaud | 336/192 |
| 4,170,014 A | * | 10/1979 | Sully | 343/749 |

OTHER PUBLICATIONS

"A Transmit–Only/Receive–Only (TORO) RF System for High–Field MRI/MRS Applications" by Enzo A. Barberi, Joseph S. Gati, Brian K. Rutt and Ravi S. Menon, Magnetic Resonance in Medicine, pp. 43:284–289 (2000).
http://www.cis.rit.edu/class/schp730/lect/lect-17.htm, Magnetic Resonance Imaging by Joseph P. Hornak, Ph.D., pp. 1–11.

* cited by examiner

*Primary Examiner*—Tuyen T Nguyen
(74) *Attorney, Agent, or Firm*—Robert R. Williams

(57) ABSTRACT

Methods and apparatus are disclosed for a tunable inductor. A coil of electrically conducting material is wrapped around a coilform, preferably generally cylindrical in shape. The coilform is constructed having a threaded portion of screw-like ridges with troughs between the ridges. The coilform may also have an unthreaded portion. The ridges and troughs of the threaded portion may run along substantially all of the coilform or just a portion of the coilform. As the coilform is rotated, the electrical conductor is engaged in the threads, changing the shape of the coil, and thereby also changing the inductance of the coil.

14 Claims, 3 Drawing Sheets

ADJUSTABLE COILFORM FOR VARIABLE INDUCTANCE

BACKGROUND OF THE INVENTION

1. Field of the Invention

The present invention generally relates to inductors, and more specifically, to variable inductors.

2. Description of the Related Art

Inductance is typified by the behavior of a coil of an electrical conductor in resisting any change of electric current through the coil. Faraday's law defines inductance in terms of the amount of voltage generated to oppose a given change in current: $V=-L*di/dt$ where L is inductance, in henries, V is voltage in volts, and di/dt is change of current in amperes per second.

The inductance of a coil comprising an electrical conductor is entirely determined by the physical properties of the coil. The electrical conductor is commonly made of wire (e.g., copper, aluminum, etc). Wire will be used hereafter to describe the conducting material, although those skilled in the art will understand that any conducting material is contemplated. Coils are also commonly called inductors. A coil has a number of loops, or turns, about an axis of the coil. As electrical current flows through the wire, a magnetic field is created around the wire. As the electrical current increases, the magnetic field increases. The magnetic field cuts other loops in the coil and has the effect of increasing the opposition to a change in current. As described above, opposition to a change in current is inductance.

Inductors may have various materials (including air) forming some or all of the volume axially inside the coil. The material chosen is called the core of the inductor. Ferrous materials (or other magnetic materials) are often used as the core of the inductor, and use of such materials dramatically increases the inductance of the inductor. Air is also frequently used as the core. Nonmagnetic materials, such as plastic, are often used to wrap the wire around, but do not substantially alter the inductance of the coil, and such coils are also generally referred to as air core inductors. Some environments require that no magnetic materials be used in the inductor. For example, variable inductors used in Magnetic Resonance Imagers (MRI) applications, must have no magnetic material in volumes sensitive to such materials. For example, "birdcage" resonators often used with MRI applications must be designed without magnetic materials. For an overview of birdcage resonators and associated circuitry, see "A Transmit-Only/Receive-Only (TORO) RF System for High-Field MRI/MRS Applications", by Enzo A. Barberi, et al., published in Magnetic Resonance in Medicine 43:284–289 (2000), hereinafter "Barberi". This reference can currently be read at http://www.lfmrr.rri.on.ca/research/MRM Barberi hybrid TORO.pdf on the WorldWide Web. Another background reference is "Magnetic Resonance Imaging", by Joseph P. Hornak, Ph.D., which can currently be read at http://www.cis.rit.edu/class/schp730/lect/lect-17.htm.

There are several factors that affect the inductance of a coil. The number of turns of the coil, the diameter of the coil, the length of the coil, the number of layers of wires in the coil, and the type of material used in the core all affect the inductance of the coil, as is known by those skilled in the art. For example, if twice as many turns of wire are used (other factors being the same), the inductance will increase by a factor of four, the inductance varying as the square of the number of turns of the wiring. (The field is twice as strong and the field cuts twice as many turns). The diameter of the coil also dramatically affects the inductance of the coil. Inductance increases as the square of the cross-sectional area of the coil. The length of the coil affects the inductance as well, since, for a given number of turns of the coil, as the coils are stretched apart, fewer magnetic flux linkages exist due to the greater distance between each turn. Other factors being the same, doubling the length of a coil halves the inductance of the coil. Finally, the type of core material used affects the inductance of the coil. A ferrous (e.g., soft iron) core has a high magnetic permeability relative to an air core resulting in more lines of magnetic force, thus increasing the inductance of the coil. Inductance is directly proportional to the permeability of the core material.

With the above brief review of inductors behind us, we turn to the problem of constructing an adjustable method of tuning a coil's inductance. Applications exist for tuning inductors in medical, industrial, and scientific application. In many ferrous (or other magnetic material) core inductors, inductance is tuned by controlling the distance of penetration of a magnetic material into the core of the inductor. For example, the portion of the core filled by the magnetic material is determined by turning a threaded screw which pushes/pulls the magnetic material along the axis of the coil. As the magnetic material comprises more of the core, inductance of the coil increases.

Tuning of an air core inductor is more difficult than tuning a magnetic material core inductor. Air core inductors are required in some environments. We are faced with the prospect of "squeezing" or pulling apart air core coils in an attempt to adjust them to their desired inductance value. Squeezing together or pulling apart the windings of an air core coil is mechanically awkward or impossible to do, depending on the position of the air core coil in the electronic system. Furthermore, if relatively high magnetic fields are created, electromechanical forces can cause the length of the coil to be shortened, especially if relatively thin wire is used in the coil.

Therefore, apparatus and methods are needed to facilitate adjustment of an inductor by altering the physical shape of the inductor and holding the inductor in the desired shape.

SUMMARY OF THE INVENTION

The present invention provides for an inductor comprising a coil of wire wrapped around a coilform, the value of the inductance being easily adjusted.

In an embodiment, the wire of the coil is wound around a coilform. The coilform is constructed having a screw like thread on at least a portion of the coilform. The screw like thread has ridges and troughs. At least a portion of the wire of the coil is wound in the troughs.

In an embodiment, a pitch of the screw like thread varies from a first end of the thread to a second end of the thread, so that rotation of the coilform causes the coils of the inductor to be spread out, thereby reducing the inductance of the coil.

In another embodiment, the coilform comprises an unthreaded portion and a threaded portion. Initially, substantially all of the turns of the coil are wrapped around the unthreaded portion of the coilform. As the coilform is rotated about its axis, the coil is engaged by the thread on the threaded portion of the coilform and as further rotation of the coilform occurs, a number of windings of the coil are spread out by the threads, which may have a uniform thread or a varying pitch thread. In an embodiment, the diameter of the coil in the trough of the threaded portion of the coilform is different than the diameter of the coil on the unthreaded portion of the coilform.

In yet another embodiment, the coilform comprises a thread having a decreasing pitch and an increasing diameter so that inductance is increased both by the compaction of the coils and by the increase in crossectional diameter of the coil. The diameter of a threaded portion of the coilform is intended to denote the diameter measured at the bottom of the troughs of the threaded portion. In an embodiment, the rate of the decreasing pitch and the rate of increase of diameter is such that the total length of the wire in the coil remains substantially constant as the coilform is rotated. In an alternative embodiment, the coilform comprises a thread having an increasing pitch and a decreasing diameter so that inductance is decreased both by the increasing separation of the coils and the decreasing diameter of the crossectional area of the inductor. As before, in a preferred embodiment, the total length of the wire in the coil remains substantially constant as the coilform is rotated.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENTS

The present invention is a method and apparatus for varying inductance of a coil. An electrical conductor, hereinafter called a wire, is wrapped around at least a portion of a coilform, forming a coil comprising the inductor. The coilform, when rotated, varies one or more physical characteristics of the coil, and therefore, the inductance of the inductor.

Figure 1A:
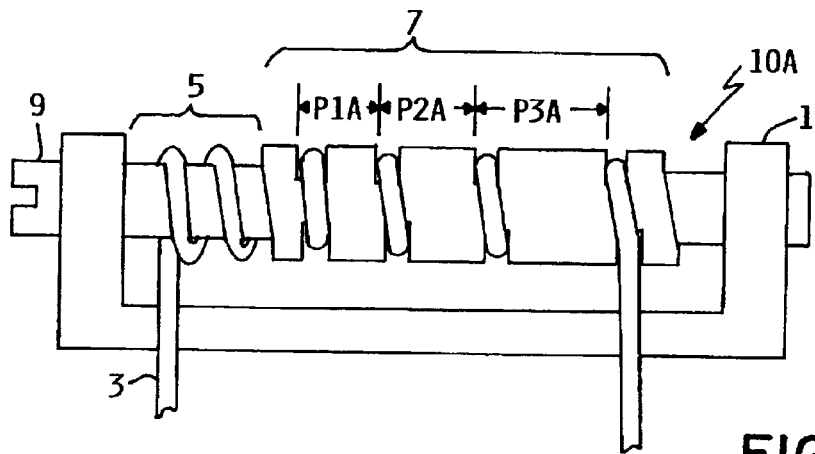
FIG. 1A shows a coilform held by a support. A wire coil is wrapped around the coilform. The coilform has an unthreaded portion and a threaded portion.

Turning now to FIG. 1A, a coilform 10A is shown being held by a support 1. Coilform 10A is preferably substantially cylindrical and is capable of being rotated about its longitudinal axis. Coilform 10A, in an embodiment, is held by frictional forces, a diameter (diameter 4 in cross sectional view of FIG. 1A) of the coilform being substantially equal to a diameter of a hole in support 1. Alternatively, a fine thread on coilform 10A mates with a fine thread on support 1. The present invention contemplates any variation of support 1 capable of holding coilform 10A. For example, support 1 in an embodiment comprises two separate portions, each portion holding a portion of coilform 10A.

Tool adapter 9 is provided on a first end of coilform 10A to allow a tool (not shown) to rotate coilform 10A about its axis. Tool adapter 9 is shown as a simple slot formed on a first end of coilform 10A, suitable for coupling to a flat bladed screwdriver. However, any tool adapter 9 is contemplated to couple any tool capable of rotating coilform 10A about its longitudinal axis. Tools contemplated include, but are not limited to, flat bladed screwdrivers, Phillips screwdrivers, torx drivers, allen wrenches, open end wrenches, and socket wrenches. A flattened portion (e.g., similar to a wing nut) in an embodiment (not shown) allows fingers to be used as a tool to rotate coilform 10A. Tools constructed of nonmagnetic materials are frequently required for use in MRI and birdcage resonator applications or other applications where magnetic materials are not allowed.

Coilform 10A comprises, in FIG. 1A, an unthreaded portion 5 and a threaded portion 7. Threaded portion 7 has a thread comprising ridges and troughs running as helixes on threaded portion 7. A wire 3 engages some or all of the threading in threaded portion 7. In an embodiment, wire 3 is also wound around a portion of unthreaded portion 5. Coil spacing of wire 3 around unthreaded portion 5 is advantageously small, with the wire turns close together, or preferably touching, if wire 3 is coated with an insulating material. As coilform 10A is rotated about its longitudinal axis, a portion of wire 3 is engaged by the threaded portion 7 and the spacing between turns of wire 3 is altered, changing the inductance of the coil.

FIG. 1A shows thread pitch increasing to the right. That is, P3A>P2A>P1A, where P1A, P2A, and P3A are the thread pitches. Thread pitch variation is continuous in an embodiment. Thread pitch is constant in for the entirety of threaded portion 7 in another embodiment. Thread pitch is a first constant pitch for a first section in threaded portion 7 and is a second constant pitch for a second section in threaded portion 7 in another embodiment.

In an alternative embodiment, the pitch of the thread in threaded portion 7 of coilform 10A remains constant, but the diameter of coilform 10A increases. As discussed earlier, inductance varies as the square of the cross sectional diameter of a coil.

Care must be taken when using the coilform of FIG. 1A to account for an increasing length of wire in the coil as the coil is engaged by and stretched by the threaded portion 7 of coilform 10A, thus stretching the length of the coil, or, as described, decreasing the diameter of the coil. (As a curly telephone cord is stretched, the diameter is seen to decrease.)

Figure 1B:
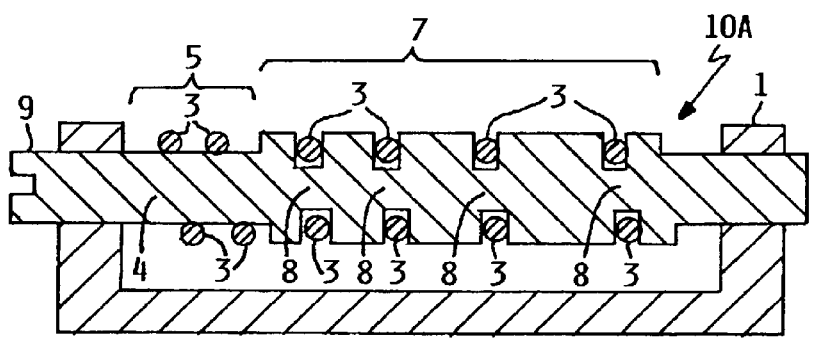
FIG. 1B shows a cross sectional view of the support, the coilform, and the wire of FIG. 1A.

The cross sectional view of coilform 10A, wire 3, and support 1 shown in FIG. 1B shows a preferred design of the threading that avoids stressing wire 3 as thread pitch increases. Originally, some or the entire coil is wound about unthreaded portion 5 having a diameter 4. As the coil is engaged by threaded portion 7, the diameter of the coil will tend to decrease as the coil is stretched by the grooves of the thread. Thread trough diameter 8, measured from the bottom of the trough, is shown in the cross sectional view, is less than diameter 4, allowing wire 3 to constrict to a reduced diameter as needed in threaded portion 7. The diameter of thread trough diameter 8, relative to diameter 4 of unthreaded portion 5, is determined by the length of the coil and the degree of elongation of the coil as the coil is stretched by threaded portion 7.

Figure 1C:
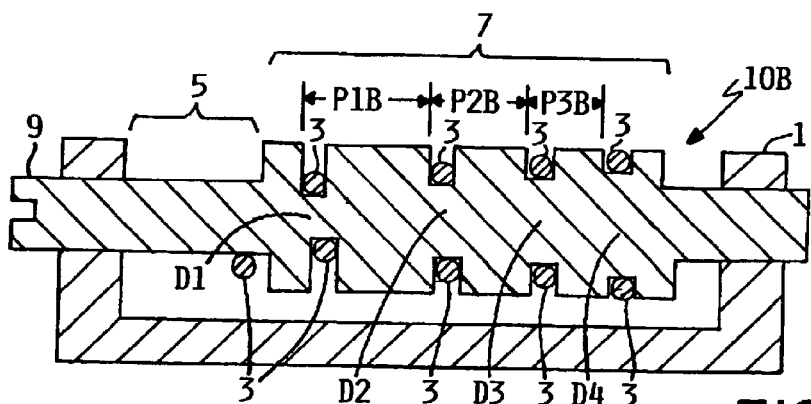
FIG. 1C shows a cross sectional view of a coilform variant held by a support. A wire coil is wrapped around the coilform. The coilform has both a variable pitch thread on the threaded portion and a varying diameter of the threaded portion of the coilform.

FIG. 1C shows a cross sectional view of an embodiment that allows for the length of wire 3 in the coil to remain substantially constant as coilform 10B is rotated about its longitudinal axis. Support 1, tool adapter 9, unthreaded portion 5, and wire 3 were described previously in the discussion of FIG. 1A. The thread trough diameter about which wire 3 is wound about coilform 10B increases as thread pitch decreases, thereby keeping the total length of wire in the coil substantially constant. In the embodiment of FIG. 1C, wire 3 rests on the inner portion (trough) of the groove of threaded portion 7. As shown, P1B>P2B>P3B; but diameters D1<D2<D3<D4, where P1B, P2B, and P3B are pitches as described above, and D1, D2, D3, and D4 are diameters of the inner portions of the threads. Appropriate choices of thread pitch decrease and coilform diameter increase can maintain the length of wire 3 in the coil at a substantially constant length, or at least within prespecified bounds (e.g., the wire in the coil to remain constant within 3 mm). Those skilled in the art will recognize that in an alternative embodiment, the diameter of the coilform decreases to the right of coilform 10B while thread pitch in threaded portion 7 increases to the right.

Figure 2:
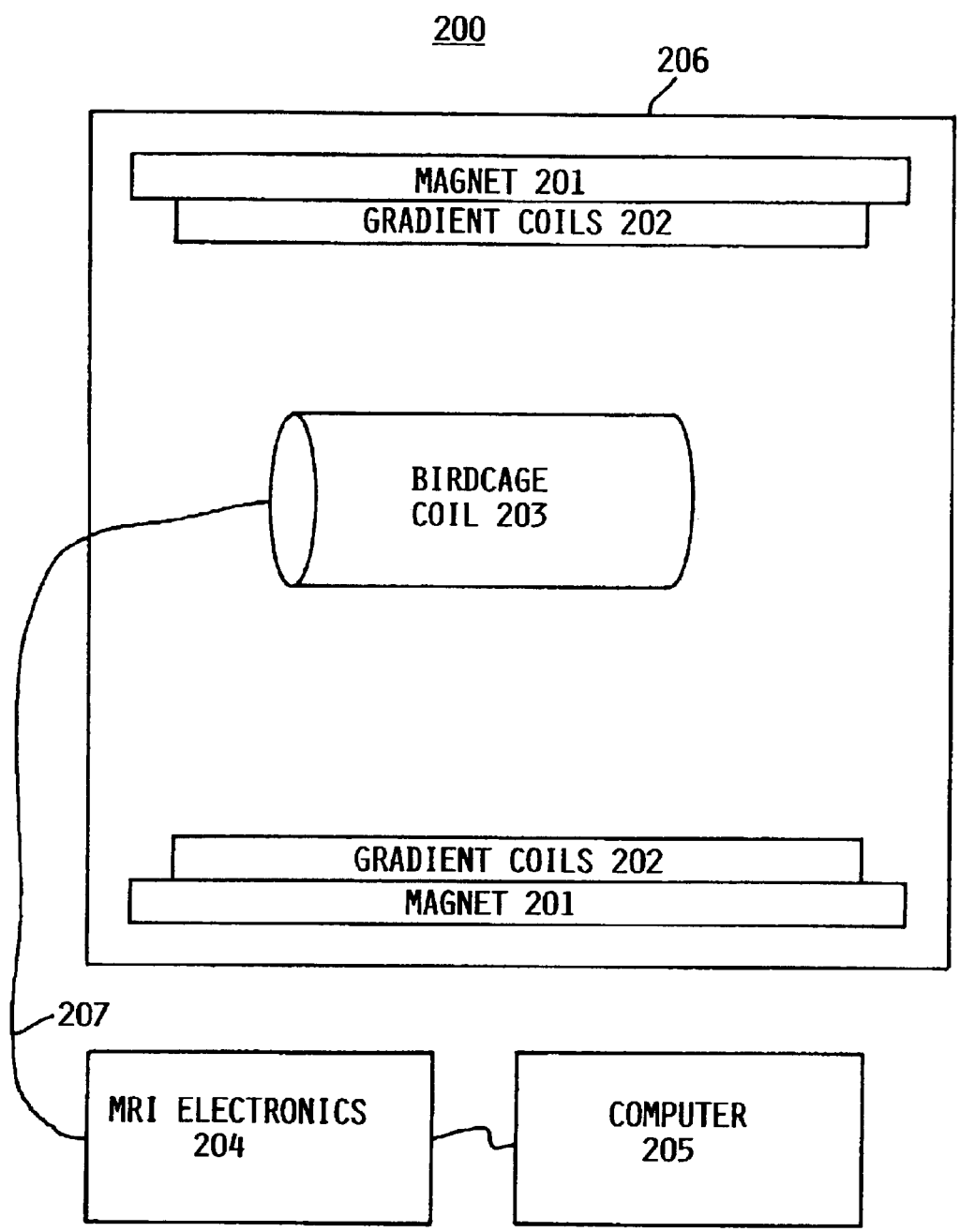
FIG. 2 is a block diagram showing a birdcage coil used with an MRI system.

Some environments in which variable inductors are used, e.g., Magnetic Resonance Imaging (MRI) devices require that no magnetic materials exist within MRI coils. For such environments, the coilform must be made of nonmagnetic material, such as plastic, for example. The present invention, using nonmagnetic coil forms, is well suited for use in the air core inductor coils required on birdcage resonators used with MRI apparatus for which references were given earlier. All inductors shown in the birdcage resonator, for example, in FIG. 2 of Barberi, are well suited for the variable inductors taught by the present invention. The birdcage resonator is relatively small and is easily dropped or mishandled, and benefits from the mechanical resistance to deformation of the coil wound about the coilform of the present invention, described below. The ease in tuning of an air core inductor as taught in the present invention is also of high value in tuning the birdcage resonator. FIG. 2 shows a block diagram of an MRI system, generally denoted as 200. A toroidal shaped coil area 206 accommodates magnets 201 and gradient coils 202. A birdcage resonator 203 is one form of an RF (Radio Frequency) device in which a portion of a human body, such as an arm, may be placed to be imaged by MRI system 200. During the taking of MRI images, birdcage coil 203 is placed within toroidal shaped coil area 206. Birdcage coil 203 is coupled to MRI electronics 204 by a cable 207. MRI electronics 204 is further coupled to a computer 205, which analyzes the data for a particular MRI image and stores and/or presents it to medical personnel for interpretation. Both birdcage coil 203 and MRI electronics 204 typically have a requirement for at least one tunable inductor, and the tunable inductor of the present invention is well suited for application both in birdcage coil 203 and MRI electronics 204.

A further advantage of the invention is that the wire is held in place by the coilform. A self-supporting conventional air core inductor is subject to accidental deformation should a piece of electronic equipment including the conventional air core inductor be dropped or otherwise mechanically stressed by high acceleration or deceleration forces. For example, if the piece of equipment is dropped and impacts the floor while a conventional air core inductor is in a horizontal position, the coil of the conventional air core inductor, being supported only at the ends, may take on a bowed shape, changing the inductance of the conventional air core inductor. The tunable inductor of the present invention is supported along the longitudinal axis of the coilform. Furthermore, all portions of the wire engaged in the threaded portion of the coilform are held securely in grooves of treaded portion 7 from such accidental deformation by the sides of the trough of the threading.

Figure 3:
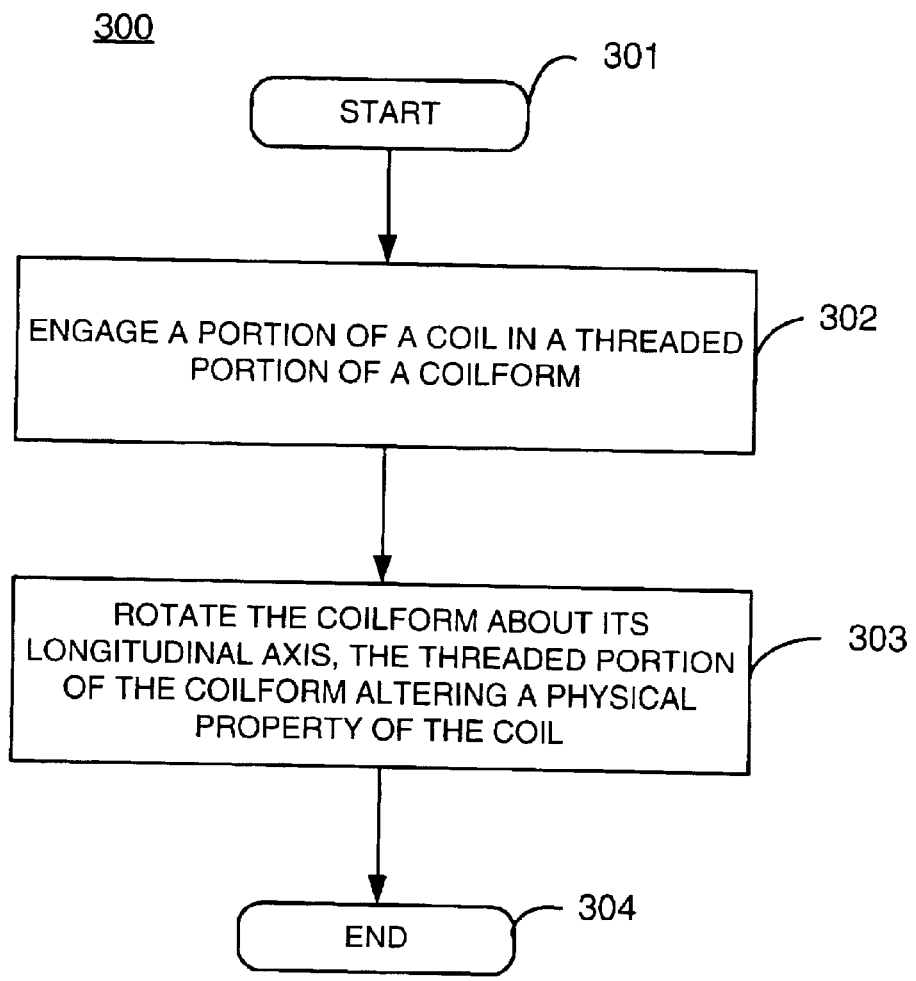
FIG. 3 is a high level flow chart of a method to alter a physical property of a coil using a coilform having a threaded portion.

FIG. 3 shows a high level flow chart of a method, generally referred to by reference numeral 300, of altering a physical property of a coil using the present invention. Step 301 starts the method. Step 302 engages a portion of a coil in a threaded portion of a coilform. The entire portion is engaged in the threaded portion in an embodiment. In another embodiment, only a fraction of a single winding of the coil is engaged in the threaded portion of the coilform. The present invention contemplates any amount of engagement of the coil in the threaded portion of the coilform. In step 303, the coilform is rotated about its longitudinal axis, the threaded portion of the coilform altering a physical property of the coil. Earlier discussion has described a number of alterations of a physical property of the coil, including stretching the coil, compressing the coil, increasing a cross sectional diameter of at least a portion of the coil, or decreasing a cross sectional diameter of at least a portion of the coil. In an embodiment, both a length of the coil and a cross sectional diameter are altered for at least a portion of the coil. Step 304 ends method 300.

While the foregoing is directed to embodiments of the present invention, other and further embodiments of the invention may be devised without departing from the basic scope thereof, and the scope thereof is determined by the claims that follow.

What is claimed is:

1. An inductor comprising:
   a coilform having a threaded portion with thread ridges and troughs extending at least a portion of the length of the coilform, the threaded portion of the coilform having a variable pitch thread along the threaded portion of the coilform;
   an electrical conductor having a coil comprising a number of turns wrapped around at least a portion of a length of the coilform, at least a portion of the coil is engaged with the threaded portion of the coilform; and
   means to rotate the coilform about a longitudinal axis of the coilform;
   wherein a determinant of an inductance of the inductor is an amount of rotation of the coilform about the longitudinal axis of the coilform.

2. The inductor of claim 1, wherein a diameter of an unthreaded portion of the coilform has a larger diameter than a diameter of the troughs in the threaded portion.

3. The inductor of claim 1, wherein the threaded portion of the coilform has a decreasing diameter along the length of the threaded portion.

4. The inductor of claim 3, wherein the threaded portion of the coilform has a pitch that increases along the length of the threaded portion.

5. The inductor of claim 1, wherein the threaded portion of the coilform has a pitch that decreases along the length of the threaded portion.

6. The inductor of claim 5, wherein the threaded portion of the coilform has a diameter that increases along the length of the threaded portion.

7. The inductor of claim 1, the threaded portion of the coilform comprising:
   an increasing thread pitch from a first portion of the threaded portion of the coilform to a second portion of the threaded portion of the coilform; and a decreasing diameter of the threaded portion of the coilform from the first portion of the threaded portion of the coilform to the second portion of the threaded portion of the coilform;

the decreasing diameter of the coilform and the increasing pitch of the coilform designed such that a total length of the electrical conductor in the coil remains substantially constant.

8. The inductor of claim 1, the threaded portion of the coilform comprising:

a decreasing thread pitch from a first portion of the threaded portion of the coilform to a second portion of the threaded portion of the coilform; and an increasing diameter of the threaded portion of the coilform from the first portion of the threaded portion of the coilform to the second portion of the threaded portion of the coilform;

the increasing diameter of the coilform and the decreasing pitch of the coilform designed such that a total length of the electrical conductor in the coil remains substantially constant.

9. The inductor of claim 1, the means to rotate the coilform about its longitudinal axis comprising:

a support holding a first supporting portion and a second supporting portion of the coilform, the coilform being capable of being rotated about its longitudinal axis in the bracket; and a tool coupler that allows a tool to rotate the coilform about its longitudinal axis.

10. The inductor of claim 9, the tool selected from the group consisting of a flat bladed screwdriver, a Phillips screwdriver, a torx driver, an allen wrench, an open end wrench, and a socket wrench.

11. The inductor of claim 1, the coilform being made of nonmagnetic material.

12. The inductor of claim 1, the coilform capable of preventing deformation of at least a portion of the coil upon high acceleration/deceleration events.

13. A birdcage resonator comprising:

a coilform having a threaded portion extending over at least a portion of the length of the coilform, the threaded portion of the coilform having a variable pitch thread along the threaded portion of the coilform;

an electrical conductor having a coil comprising a number of turns wrapped around at least a portion of a length of the coilform, at least a portion of the coil being engaged with the threaded portion of the coilform; and means to rotate the coilform about a longitudinal axis of the coilform;

wherein a determinant of an inductance of the inductor is an amount of rotation of the coilform about the longitudinal axis of the coilform.

14. A magnetic resonance imaging apparatus comprising:

a coilform having a threaded portion extending at least a portion of the length of the coilform, the threaded portion of the coilform having a variable pitch thread along the threaded portion of the coilform;

an electrical conductor having a coil comprising a number of turns wrapped around at least a portion of a length of the coilform, at least a portion of the coil being engaged with the threaded portion of the coilform; and means to rotate the coilform about a longitudinal axis of the coilform;

wherein a determinant of an inductance of the inductor is an amount of rotation of the coilform about the longitudinal axis of the coilform.

* * * * *